(12) United States Patent
Zheng et al.

(10) Patent No.: US 6,861,307 B2
(45) Date of Patent: Mar. 1, 2005

(54) FULLY ISOLATED DIELECTRIC MEMORY CELL STRUCTURE FOR A DUAL BIT NITRIDE STORAGE DEVICE AND PROCESS FOR MAKING SAME

(75) Inventors: Wei Zheng, Sunnyvale, CA (US); Mark W. Randolph, San Jose, CA (US); Nicholas H. Tripsas, San Jose, CA (US); Zoran Krivokapic, Santa Clara, CA (US); Jack F. Thomas, Palo Alto, CA (US); Mark T. Ramsbey, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/631,199

(22) Filed: Jul. 31, 2003

(65) Prior Publication Data

US 2004/0021172 A1 Feb. 5, 2004

Related U.S. Application Data

(62) Division of application No. 10/027,253, filed on Dec. 20, 2001, now Pat. No. 6,639,271.

(51) Int. Cl.[7] .......................................... H01L 21/8238
(52) U.S. Cl. ...................................... 438/216; 438/212
(58) Field of Search ................................ 438/212, 216, 438/264, 585, 623, 593

(56) References Cited

U.S. PATENT DOCUMENTS

| 5,168,334 A | | 12/1992 | Mitchell et al. |
|---|---|---|---|
| 5,405,805 A | | 4/1995 | Homma |
| 5,619,052 A | | 4/1997 | Chang et al. |
| 5,768,192 A | | 6/1998 | Eitan |
| 5,774,400 A | * | 6/1998 | Lancaster et al. ......... 365/185.3 |
| 6,011,725 A | * | 1/2000 | Eitan ...................... 365/185.33 |
| 6,249,022 B1 | | 6/2001 | Lin et al. |
| 6,331,951 B1 | | 12/2001 | Bautista, Jr. et al. |
| 6,469,341 B1 | * | 10/2002 | Sung et al. .................. 257/316 |
| 6,493,266 B1 | | 12/2002 | Yachareni et al. |
| 6,737,341 B1 | * | 5/2004 | Yamamoto et al. .......... 438/585 |

* cited by examiner

*Primary Examiner*—Long Pham
*Assistant Examiner*—Hoa B. Trinh
(74) *Attorney, Agent, or Firm*—Renner, Otto, Boisselle & Sklar, LLP

(57) ABSTRACT

A method of fabricating a dual bit dielectric memory cell structure on a silicon substrate includes implanting buried bit lines within the substrate and fabricating a layered island on the surface of the substrate between the buried bit lines. The island has a perimeter defining a gate region, and comprises a tunnel dielectric layer on the surface of the silicon on insulator wafer, an isolation barrier dielectric layer on the surface of the tunnel dielectric layer, a top dielectric layer on the surface of the isolation barrier dielectric layer, and a polysilicon gate on the surface of the top dielectric layer. A portion of the isolation barrier dielectric layer is removed to form an undercut region within the gate region and a charge trapping material is deposited within the undercut region.

20 Claims, 3 Drawing Sheets

FULLY ISOLATED DIELECTRIC MEMORY CELL STRUCTURE FOR A DUAL BIT NITRIDE STORAGE DEVICE AND PROCESS FOR MAKING SAME

This is a division of application Ser. No. 10/027,253, filed Dec. 20, 2001, now U.S. Pat. No. 6,639,271.

TECHNICAL FIELD

The present invention relates generally to flash memory cell devices and more specifically, to improvements in dielectric memory cell structures for dual bit storage and a process for making the improved dielectric memory cell structure.

BACKGROUND OF THE INVENTION

Conventional floating gate flash memory types of EEPROMs (electrically erasable programmable read only memory), utilize a memory cell characterized by a vertical stack of a tunnel oxide ($SiO_2$), a polysilicon floating gate over the tunnel oxide, an interlayer dielectric over the floating gate (typically an oxide, nitride, oxide stack), and a control gate over the interlayer dielectric positioned over a crystalline silicon substrate. Within the substrate are a channel region positioned below the vertical stack and source and drain diffusions on opposing sides of the channel region.

The floating gate flash memory cell is programmed by inducing hot electron injection from the channel region to the floating gate to create a non volatile negative charge on the floating gate. Hot electron injection can be achieved by applying a drain to source bias along with a high control gate positive voltage. The gate voltage inverts the channel while the drain to source bias accelerates electrons towards the drain. The accelerated electrons gain 5.0 to 6.0 eV of kinetic energy which is more than sufficient to cross the 3.2 eV Si—$SiO_2$ energy barrier between the channel region and the tunnel oxide. While the electrons are accelerated towards the drain, those electrons which collide with the crystalline lattice are re-directed towards the Si—$SiO_2$ interface under the influence of the control gate electrical field and gain sufficient energy to cross the barrier.

Once programmed, the negative charge on the floating gate increases the threshold voltage of the FET characterized by the source region, drain region, channel region, and control gate. During a "read" of the memory cell, the magnitude of the current flowing between the source and drain at a predetermined control gate voltage indicates whether the flash cell is programmed.

More recently dielectric memory cell structures have been developed. A conventional dielectric memory cell 10 is shown in cross section in FIG. 1 and is characterized by a vertical stack of an insulating tunnel dielectric layer 12, a charge trapping dielectric layer 14, an insulating top oxide layer 16, and a polysilicon control gate 18 positioned on top of a crystalline silicon substrate 15. Within the substrate 15 are a channel region 17 positioned below the vertical stack and source diffusion 19 and drain diffusion 23 on opposing sides of the channel region 17. This particular structure of a silicon channel region 22, tunnel oxide 12, nitride 14, top oxide 16, and polysilicon control gate 18 is often referred to as a SONOS device.

Similar to the floating gate device, the SONOS memory cell 10 is programmed by inducing hot electron injection from the channel region 17 to the nitride layer 14 to create a non volatile negative charge within charge traps existing in the nitride layer 14. Again, hot electron injection can be achieved by applying a drain-to-source bias along with a high positive voltage on the control gate 18. The high voltage on the control gate 18 inverts the channel region 17 while the drain-to-source bias accelerates electrons towards the drain region 23. The accelerated electrons gain 5.0 to 6.0 eV of kinetic energy which is more than sufficient to cross the 3.2 eV Si—$SiO_2$ energy barrier between the channel region 17 and the tunnel oxide 12. While the electrons are accelerated towards the drain region 23, those electrons which collide with the crystalline lattice are re-directed towards the Si—$SiO_2$ interface under the influence of the control gate electrical field and have sufficient energy to cross the barrier. Because the nitride layer stores the injected electrons within traps and is otherwise a dielectric, the trapped electrons remain localized within a drain charge storage region 13 that is close to the drain region 23 (or in a source charge storage region 11 that is close to the source region 19 if a source to drain bias is used) from which the electrons were injected. As such, the SONOS device can be used to store two bits of data, one in each of the charge storage regions 11 and 13, per cell and are typically referred to as dual bit SONOS devices.

A problem associated with dual bit SONOS structures is that the trapped charge in the drain and source charge storage regions 13 and 11 has a finite spatial distribution that peaks at the drain region 23 and source region 19 respectively and a portion of the charge distribution will spread into the area between the source charge storage region 11 and the drain charge storage region 13. The spread charge effects the threshold voltage during the read cycle. The charge that accumulates between the source charge storage region 11 and the drain charge storage region 13 is difficult to remove utilizing the hot hole injection erase mechanism. Additionally, charge spreading become more problematic over the lifetime of operation of the device. Each program/erase cycle, may cause further spread of electrons into the area between source charge storage region 11 and the drain charge storage region 13. The problem is further compounded by the continued decrease in the size of the semiconductor devices, which calls for nitride layers with less area separating the two charge storage regions 11 and 13.

A need exists in the art for a dual bit memory cell structure which does not suffer the disadvantages discussed above.

SUMMARY OF THE INVENTION

A first aspect of the present invention is to provide a dual bit dielectric memory cell that comprises a substrate with a source region, a drain region, and a channel region positioned there between. A multilevel charge trapping dielectric is positioned on the surface of the substrate over the channel region and a control gate is positioned on the surface of the multilevel charge trapping dielectric. The multilevel charge trapping dielectric includes a tunnel layer adjacent to the substrate that may comprise a dielectric material with a very low hydrofluoric acid etch rate. The multilevel charge trapping dielectric also includes a top dielectric layer adjacent to the control gate of a second dielectric material selected from the group consisting of an aluminum oxide compound, a Hafnium oxide compound, and a zirconium oxide compound. Such materials may comprise $Al_2O_3$, $HfSiO_x$, $HfO_2$, and $ZrO_2$.

A charge trapping layer is positioned between the tunnel layer and the top dielectric layer and includes a source charge trapping region and a drain charge trapping region separated by an isolation barrier, that may be an oxide, there between. The charge trapping layer may have a thickness range from about 50 A to 100 A in thickness.

The source charge trapping region and the drain charge trapping region may be comprised of a nitride compound such as a material selected from the group consisting of $Si_2N_4$ and $SiO_xN_4$. The source charge trapping region and the drain charge trapping region may each have a lateral width beneath the top dielectric layer from about 300 A to 500 A.

A second aspect of the present invention is to provide a method of storing data in dual bit dielectric memory cell, the method comprising: a) utilizing a source-to-drain bias in the presence of a control gate field to inject a charge into a source charge trapping region; b) utilizing a drain-to-source bias in the presence of a control get field to inject a charge into a drain charge trapping region; and c) providing an isolation barrier between the source charge trapping region and the drain charge trapping region.

A third aspect of the invention provides a method for making the dielectric memory cell structure, including steps of providing a semiconductor substrate; sequentially depositing on the substrate a first dielectric material, an oxide layer, a second dielectric material with a dielectric constant equal to or greater than the first dielectric material, and a polysilicon control gate; isotropically etching the oxide layer with HF acid to open spaces beneath the second dielectric material; and depositing a nitride charge trapping layer within the open spaces beneath the second dielectric material.

A fourth aspect of the present invention is to provide a process for fabricating a dual bit dielectric memory cell structure with an isolation barrier between two charge trapping dielectric regions.

The method comprises implanting buried bit lines within a substrate and fabricating a layered island on the surface of the substrate between the buried bit lines. The island has a perimeter defining a gate region, and comprises a tunnel dielectric layer on the surface of the silicon on insulator wafer, an isolation barrier dielectric layer on the surface of the tunnel dielectric layer, a top dielectric layer on the surface of the isolation barrier dielectric layer, and a polysilicon gate on the surface of the top dielectric layer.

A portion of the isolation barrier dielectric layer is removed to form an undercut region within the gate region and a charge trapping material, such as silicon nitride, is deposited within the undercut region.

The tunnel dielectric layer may comprise a material with a low hydrofluoric acid etch rate. As such, removing a portion of the isolation barrier dielectric layer to form an undercut region within the gate region may comprising performing an isotropic etch using dilute hydrofluoric acid. The charge trapping material may be deposited within the undercut region by depositing a layer of silicon nitride compound on the surface of the wafer using a vapor deposition process and by performing an anisotropic etch to remove the layer of the silicon nitride compound from the horizontal surfaces.

The layered island may be formed on the surface of the substrate by: a) depositing a tunnel dielectric layer on the surface of the substrate; b) depositing an isolation barrier dielectric layer on the surface of the tunnel dielectric layer; c) depositing a top dielectric layer on the surface of the isolation barrier dielectric layer; d) depositing a polysilicon gate layer on the surface of the top dielectric layer; e) masking a gate pattern on the surface of the polysilicon gate layer to define a gate region and expose a non-gate region; and f) removing the polysilicon gate layer, the top dielectric layer, the isolation barrier dielectric layer and the tunnel dielectric layer in the non-gate region.

DESCRIPTION OF THE PREFERRED EMBODIMENTS

Figure 1:
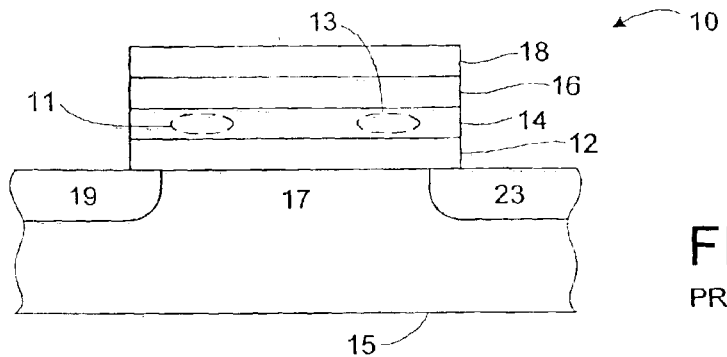
FIG. 1 is a schematic, cross sectional view of a dielectric memory cell in accordance with the prior art.

The present invention will now be described in detail with reference to the drawings. In the drawings, like reference numerals are used to refer to like elements throughout. Further, the diagrams are not drawn to scale and the dimensions of some features are intentionally drawn larger than scale for purposes of showing clarity.

Figure 2:
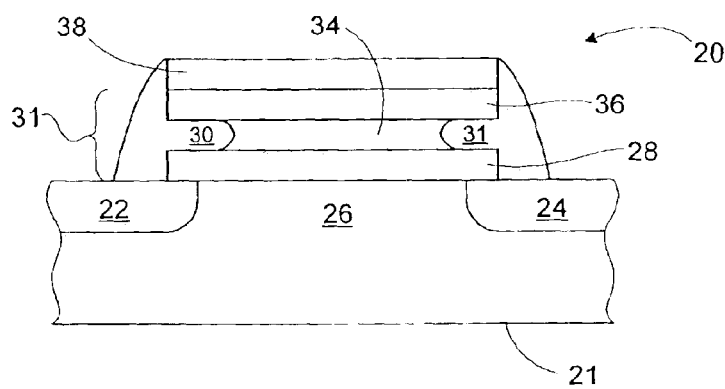
FIG. 2 is a schematic cross sectional view of a dual bit dielectric memory cell in accordance with one embodiment of this invention.

Referring to FIG. 2, an exemplary embodiment of a dual bit memory cell 20 in accordance with the present invention is shown in cross section. The dual bit memory cell 20 comprises a crystalline semiconductor substrate 21 which includes a source region 22 and a drain region 24 on opposing sides of a central channel region 26. Above the channel region 22 is a tunnel dielectric layer 28. Above the tunnel dielectric layer are a source charge trapping region 30 and a drain charge trapping region 32 separated by an isolation barrier 34. Above the source charge trapping region 30, the drain charge trapping region 32, and the isolation barrier 34 is a top dielectric layer 36 and positioned above the top dielectric layer 36 is a polysilicon gate 38.

The dual bit memory cell 20 is shown as a substantially planar structure formed on the silicon substrate 21. However, it should be appreciated that the teachings of this invention may be applied to both planar, fin formed, and other dielectric memory cell structures which may be formed on suitable semiconductor substrates which include, for example, bulk silicon semiconductor substrates, silicon-on-insulator (SOI) semiconductor substrates, silicon-on-sapphire (SOS) semiconductor substrates, and semiconductor substrates formed of other materials known in the art.

In the exemplary embodiment, the silicon substrate 21 comprises lightly doped p-type crystalline silicon and source region 22 and the drain region 24 are implanted with an n-type impurity. However, it should be appreciated that a light doped n-type crystalline silicon substrate with implanted p-type impurities within the source region 22 and the drain region 24 may readily be used.

In the exemplary embodiment, tunnel dielectric layer 28 may be comprised of a tunnel dielectric material with a low dielectric constant (e.g. low K) and a very low etch rate when etched using dilute HF. The thickness of the tunnel dielectric layer 28 may be within a range of about 50 Å to about 150 Å. An embodiment with a more narrow bracket includes a tunnel dielectric layer 28 thickness within a range of about 60 Å to about 90 Å and even narrower yet, a tunnel dielectric layer 28 with thickness of about 70 Å to about 80 Å.

The top dielectric layer 36 may be a dielectric material with a high dielectric constant. In a preferred embodiment, the material is selected from the group of $Al_2O_3$, $HfSi_xO_y$, $HfO_2$, $ZrO_2$, and $ZrXi_xO_y$ and other materials with similarly high dielectric constants. The top dielectric layer 36 has a thickness within a range of about 70 Å to 130 Å. An embodiment with a more narrow bracket includes a top dielectric layer 36 with a thickness within a range of about 80 Å to about 120 Å and even narrower yet, a top dielectric layer 205 with a thickness of about 90 Å to about 100 Å.

The isolation barrier dielectric region 34 may comprise an insulating oxide such as silicon dioxide ($SiO_2$) and may have a thickness from about 50 Å to 100 Å.

The source charge trapping region 30 and the drain charge trapping region 32 may each comprise a nitride compound with dangling bonds to provide suitable charge trapping properties. In the exemplary embodiment, the nitride compound may be selected from the group consisting of $Si_2N_4$ and $SiOxN_4$. Each of the source charge trapping region 30 and the drain charge trapping region 32 have a thickness (between the tunnel dielectric layer 28 and the top dielectric layer 36) that ranges from about 50 Å to 100 Å.

The dual bit memory cell 20 is programmed utilizing a hot electron injection technique. More specifically, programming of the first bit of data comprises injecting electrons into the source charge trapping region 30 and programming the second bit of data comprises injecting electrons into the drain charge trapping region 32. Hot electron injection into the source charge trapping region 30 comprises applying a source-to-drain bias while applying a high voltage to the control gate 38. In the exemplary embodiment, this may be accomplished by grounding the drain region 24 and applying approximately 5V to the source region 22 and approximately 10V to the control gate 38. The voltage on the control gate 38 inverts the channel region 26 while source-to-drain bias accelerates electrons from the source region 22 into the channel region 26 towards the drain region 24. The 4.5 eV to 5 eV kinetic energy gain of the electrons is more than sufficient to surmount the 3.1 eV to 3.5 eV energy barrier at channel region 26/tunnel dielectric layer 28 interface and, while the electrons are accelerated towards drain region 24, the field caused by the high voltage on control gate 38 redirects the electrons towards the source charge trapping region 30. Those electrons that cross the interface into source charge trapping region 30 remain trapped for later reading.

Similarly, programming the second bit of data by hot electron injection into the drain charge trapping region 32 comprises applying a drain-to-source bias while applying a high voltage to the control gate 38. Similar to as described above, this may be accomplished by grounding the source region 22 and applying approximately 5V to the drain region 24 and approximately 10V to the control gate 38. The voltage on the control gate 38 inverts the channel region 26 while the drain-to-source bias accelerates electrons from the drain region 24 into the channel region 26 towards the source region 22. The field caused by the high voltage on control gate 38 redirects the electrons towards the drain charge trapping region 32. Those electrons that cross the interface into drain charge trapping region 32 remain trapped for later reading.

It should be appreciated that because the source charge trapping region 30 and the drain charge trapping region 32 are separated by the insulating barrier region 34, charge will not spread into the area between the source charge trapping region 30 and the drain charge trapping region 32.

The presence of trapped electrons within each of the source charge trapping region 30 and the drain charge trapping region 32 effect depletion within the channel region 26 and as such effect the threshold voltage of a field effect transistor (FET) characterized by the control gate 38, the source region 22, and the drain region 24. Therefore, each bit of the dual bit memory cell 20 may be "read", or more specifically, the presence of electrons stored within each of the source charge trapping region 30 and the drain charge trapping region 32 may be detected by operation of the FET. In particular, the presence of electrons stored within the source charge trapping region 30 may be detected by applying a positive voltage to the control gate 38 and a lesser positive voltage to the drain region 22 while the source region grounded. The current flow is then measured at the drain region 24. Assuming proper voltages and thresholds for measurement, if there are electrons trapped within the source charge trapping region 30, no current (or at least no current above a threshold) will be measured at the drain region 24. Otherwise, if the source charge trapping region 30 is charge neutral (e.g., no trapped electrons) then there will be a measurable current flow into drain region 24. Similarly, the presence of electrons stored within the drain charge trapping region 23 may be detected by the same method, and merely reversing the source region 22 and drain region 24 for voltage and ground.

Figure 3:
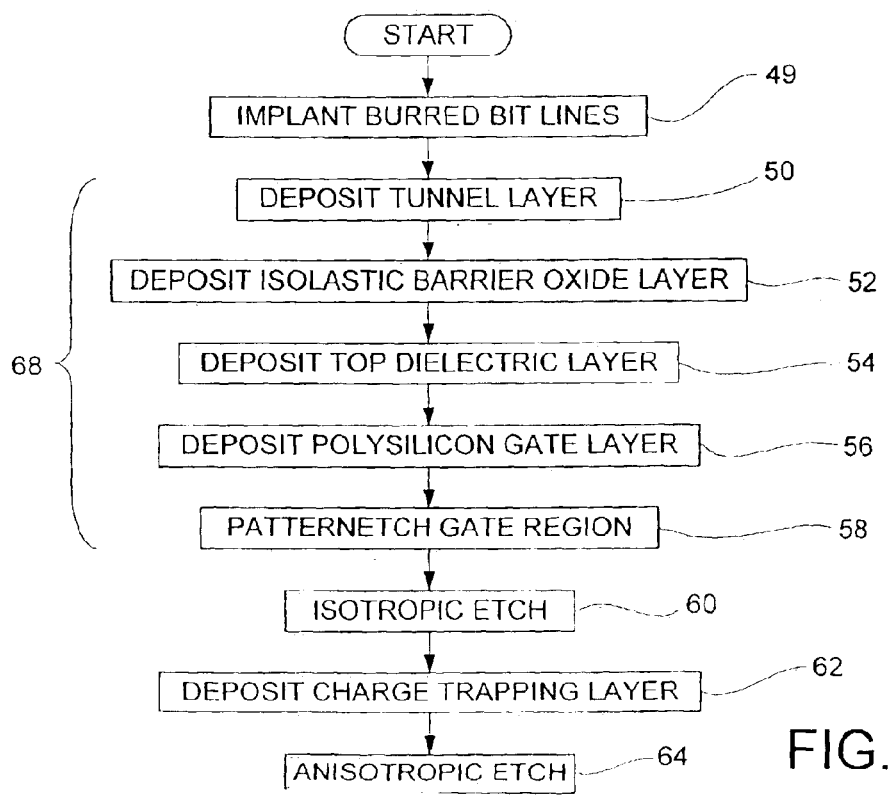
FIG. 3 is a flow chart showing exemplary steps for fabricating the dielectric memory cell of FIG. 2.

An exemplary process for fabricating the dual bit memory cell 20 on a crystalline silicon substrate is represented by the flowchart of FIG. 3. Referring to FIG. 3 in conjunction with FIG. 4b, step 49 represents implanting buried bit lines (e.g. source region 22 and drain region 24) within the substrate 24. Thereafter, steps 50 through 68 represent substeps of fabricating a layered island 29 on the surface of the substrate 21 over a channel region 26 that is positioned between the source region 22 and the drain region 24.

Figure 4A:
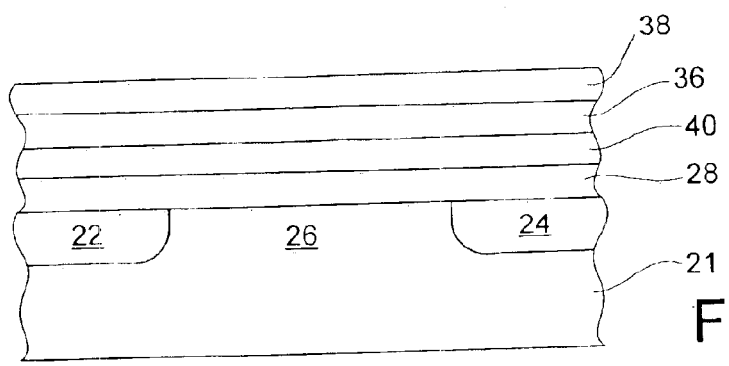
FIG. 4a is a schematic cross sectional view of a processing step in the fabrication of the dual bit dielectric memory cell of FIG. 2.

More specifically, referring to FIG. 4a (in conjunction with the flowchart of FIG. 3) step 50 represents depositing the tunnel dielectric layer 38 on the surface of the crystalline silicon substrate 21. The tunnel dielectric layer may be deposited using a low pressure chemical vapor deposition (LPCVD) process or rapid thermal chemical vapor deposition (RTCVD) process in a single wafer tool.

Step 52 represents growing an isolation barrier dielectric layer of insulating silicon dioxide 40 to a thickness of about 50 Å to 100 Å on the top surface of the tunnel dielectric layer 28. Step 54 represents depositing the top dielectric layer 36 on the surface of the isolation barrier dielectric layer 40, again a LPCVD or a RTCVD process may be used. And, step 56 represents depositing a polysilicon gate layer of polysilicon material on the surface of the top dielectric layer 36, preferably using a LPCVD process.

Figure 4B:
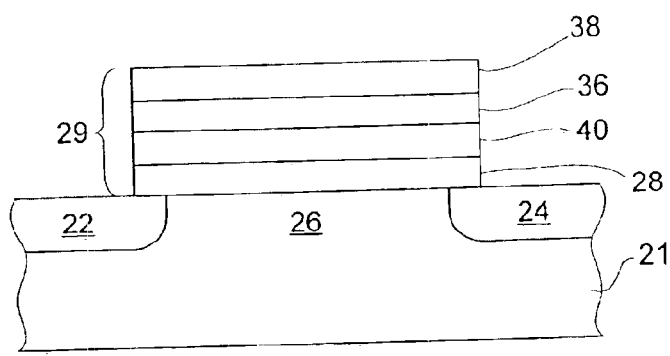
FIG. 4b is a schematic cross sectional view of a processing step in the fabrication of the dual bit dielectric memory cell of FIG. 2.

Step 58 represents patterning and etching the control gate 38. More specifically, a mask is applied to the surface of the polysilicon control gate layer 42 to define and cover the control gate 38 utilizing conventional photolithography techniques and an anisotropic etch process may be used to etch the regions of the polysilicon control gate layer 38, the top dielectric layer 36, the oxide layer 40, and the tunnel dielectric layer 28 to form the layered island 29 as is shown in FIG. 4*b*.

Figure 4C:
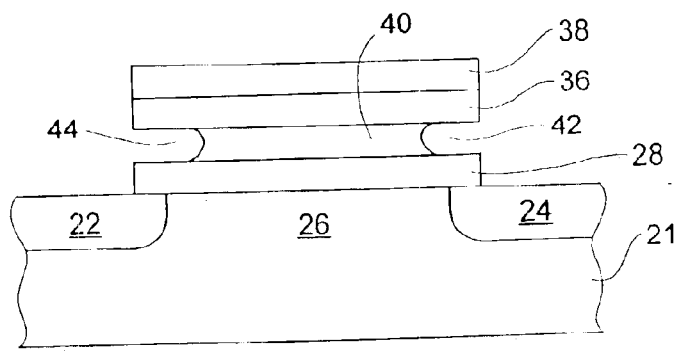
FIG. 4c is a schematic cross sectional view of a processing step in the fabrication of the dual bit dielectric memory cell of FIG. 2.

Step 60 represents performing an isotropic etch with dilute HF to laterally etch the oxide layer to open spaces between the tunnel dielectric layer 28 and the top oxide layer 36 as is shown in FIG. 4*c*. In the exemplary embodiment, the lateral etch provides for cavities 42 and 44 to have a depth of about 300 Å to 500. Thereafter, the mask and etch residue are removed.

Figure 4D:
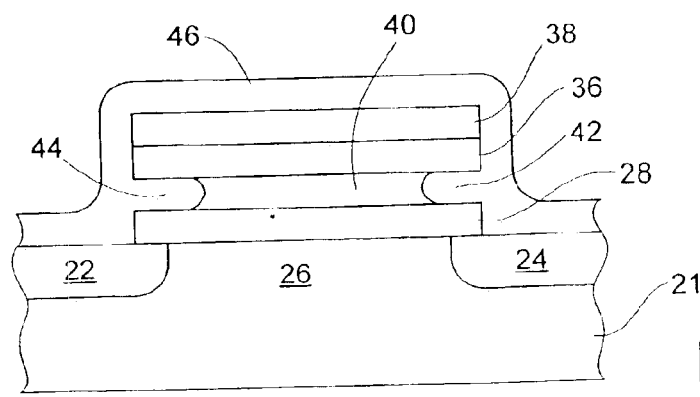
FIG. 4d is a schematic cross sectional view of a processing step in the fabrication of the dual bit dielectric memory cell of FIG. 2.
Figure 4E:
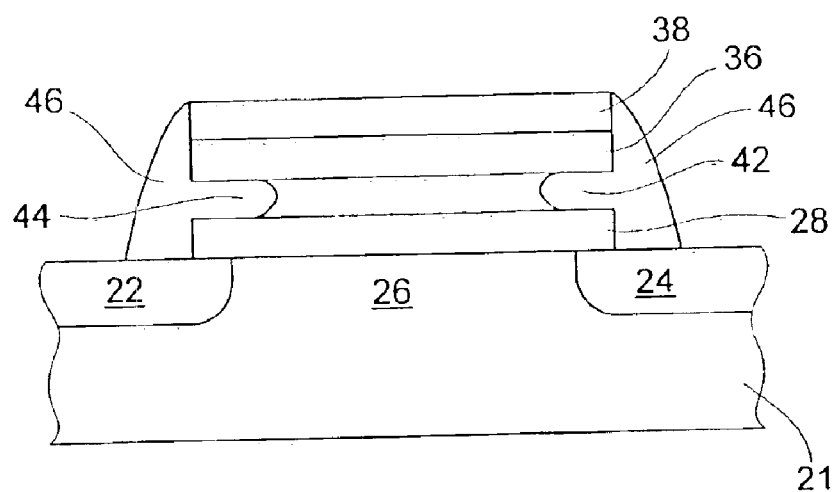
FIG. 4e is a schematic cross sectional view of, a final processing step in the fabrication of the dual bit dielectric memory cell of FIG. 2.

Step 62 represents depositing a nitride layer 46 (or another suitable charge trapping dielectric material) over the surface of the wafer using an LPCVD process as is shown in FIG. 4*d*. Thereafter, at step 64, a isotropic dry plasma etch process removes the nitride compound 46 from the vertical surface leaving the source charge trapping region 30 (including the sidewall spacer) and the drain charge trapping region 32 (including the sidewall spacer) as is shown in FIG. 4*e*.

In summary, the dual bit dielectric memory cell of this invention provides for fabrication of a smaller cell without enabling spreading of charge between a source charge trapping region and a drain charge trapping region. Although the dielectric memory cell of this invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A method of fabricating a dual bit charge storage device on a silicon substrate, the method comprising:
   a) fabricating a layered island on the surface of the substrate with an island perimeter defining a gate region, the layered island comprising a tunnel dielectric layer on the surface of the silicon on insulator wafer, an isolation barrier dielectric layer on the surface of the tunnel dielectric layer, a top dielectric layer on the surface of the isolation barrier dielectric layer, and a polysilicon gate on the surface of the top dielectric layer;
   b) removing a portion of the isolation barrier dielectric layer to form an undercut region within the gate region;
   c) depositing a charge trapping material within the undercut region;
   d) forming a charge trapping layer positioned between the tunnel dielectric layer and the top dielectric layer from the charge trapping material, the charge trapping layer including a source charge trapping region towards one end of the charge trapping layer, a drain charge trapping region towards an opposite end of the charge trapping layer, and an isolation barrier interposed between the source charge trapping region and the drain charge trapping region,
   wherein the isolation barrier is substantially less conductive relative to the source charge trapping region and the drain charge trapping region, and functions to reduce charge spread through the charge trapping layer between the source charge trapping region and the drain charge trapping region.

2. The method of claim 1, further comprising implanting buried bit lines within the substrate on opposing sides of the layered island.

3. The method of claim 1, wherein the charge trapping material is a silicon nitride compound.

4. The method of claim 3, wherein the step of depositing a charge trapping material in the undercut region comprises:
   depositing a layer of the silicon nitride compound on the surface of the wafer using a vapor deposition process;
   performing an anisotropic etch to remove the layer of the silicon nitride compound from the horizontal surface.

5. The method of claim 1, wherein:
   the tunnel dielectric layer comprises a material with a low hydrofluoric acid etch rate; and
   the step of removing a portion of the isolation barrier dielectric layer to form an undercut region within the gate region comprised performing an isotropic etch using dilute hydrofluoric acid.

6. The method of claim 5, wherein the under cut region extends between 300 A and 500 A into the gate region.

7. The method of claim 1, wherein the isolation barrier dielectric comprises silicon dioxide and has a thickness of between 50 A and 100 A.

8. The method of claim 1, wherein the top dielectric layer is a compound with a dielectric constant greater than silicon dioxide and greater than the dielectric constant of the tunnel dielectric layer.

9. The method of claim 8, wherein the top dielectric layer is a compound selected from the group of $Al_2O_3$, $HfSiO_x$, $HfO_2$, and $ZrO_2$.

10. The method of claim 9, wherein the top dielectric layer has a thickness of between 70 A and 130 A.

11. A method of fabricating a dual bit charge storage device on a silicon substrate, the method comprising:
    depositing a tunnel dielectric layer on the surface of the substrate; depositing an isolation barrier dielectric layer on the surface of the tunnel dielectric layer;
    depositing a top dielectric layer on the surface of the isolation barrier dielectric layer;
    depositing a polysilicon gate layer on the surface of the top dielectric layer;
    masking a gate pattern on the surface of the polysilicon gate layer to define a gate region and expose a non-gate region;
    removing the polysilicon gate layer, the top dielectric layer, the isolation barrier dielectric layer and the tunnel dielectric layer in the non-gate region;
    removing a portion of the isolation barrier dielectric layer to undercut the gate region and define undercut regions;
    depositing a charge trapping material within the undercut regions; and
    forming a charge trapping layer positioned between the tunnel dielectric layer and the top dielectric layer from the charge trapping material, the charge trapping layer including a source charge trapping region towards one end of the charge trapping layer, a drain charge trapping region towards an opposite end of the charge trapping layer, and an isolation barrier interposed between the source charge trapping region and the drain charge trapping region,
    wherein the isolation barrier is substantially less conductive relative to the source charge trapping region and the drain charge trapping region, and functions to reduce charge spread through the charge trapping layer between the source charge trapping region and the drain charge trapping region.

12. The method of claim 11, further comprising implanting buried bit lines on opposing sides of the gate region.

13. The method of claim 11, wherein the charge trapping material is a silicon nitride compound.

14. The method of claim 13, wherein the step of depositing a charge trapping material within the undercut region comprises:
   depositing a layer of the silicon nitride compound on the surface of the wafer using a vapor deposition process;
   performing an anisotropic etch to remove the layer of the silicon nitride compound from horizontal surfaces.

15. The method of claim 11, wherein:
   the tunnel dielectric layer comprises a material with a low hydrofluoric acid etch rate; and
   the step of removing a portion of the isolation barrier dielectric layer to undercut the gate region comprises performing an isotropic etch using dilute hydrofluoric acid.

16. The method of claim 15, wherein the under cut region extends between 300 A and 500 A into the gate region.

17. The method of claim 11, wherein the isolation barrier dielectric comprises silicon dioxide and has a thickness of between 50 A and 100 A.

18. The method of claim 11, wherein the top dielectric layer is a compound with a dielectric constant greater than silicon dioxide and greater than the dielectric constant of the tunnel dielectric layer.

19. The method of claim 18, wherein the top dielectric layer is a compound selected from the group of $Al_2O_3$, $HfSiO_x$, $HfO_2$, and $ZrO_2$.

20. The method of claim 19, wherein the top dielectric layer has a thickness of between 70 A and 130 A.

* * * * *